United States Patent
Przeslawski et al.

(10) Patent No.: US 11,014,153 B2
(45) Date of Patent: May 25, 2021

(54) METHOD FOR SEEDING A MOLD

(71) Applicant: General Electric Company, Schenectady, NY (US)

(72) Inventors: Brian David Przeslawski, Liberty Township, OH (US); Douglas G. Konitzer, West Chester, OH (US)

(73) Assignee: General Electric Company, Schenectady, NY (US)

( * ) Notice: Subject to any disclaimer, the term of this patent is extended or adjusted under 35 U.S.C. 154(b) by 256 days.

(21) Appl. No.: 15/995,931

(22) Filed: Jun. 1, 2018

(65) Prior Publication Data
US 2019/0118253 A1 Apr. 25, 2019

Related U.S. Application Data

(60) Provisional application No. 62/575,781, filed on Oct. 23, 2017.

(51) Int. Cl.
| | | |
|---|---|---|
| *B22D 27/04* | (2006.01) | |
| *B22C 9/22* | (2006.01) | |
| *B22C 9/10* | (2006.01) | |
| *C30B 11/14* | (2006.01) | |
| *C30B 29/52* | (2006.01) | |
| *B33Y 80/00* | (2015.01) | |
| *B22C 9/04* | (2006.01) | |

(52) U.S. Cl.
CPC ............. *B22D 27/045* (2013.01); *B22C 9/10* (2013.01); *B22C 9/22* (2013.01); *C30B 11/14* (2013.01); *C30B 29/52* (2013.01); *B22C 9/04* (2013.01); *B33Y 80/00* (2014.12); *F05D 2230/21* (2013.01); *F05D 2300/607* (2013.01)

(58) Field of Classification Search
CPC .... B22C 9/04; B22C 9/10; B22C 9/22; B22D 27/04; B22D 27/045; C30B 11/14; C30B 29/52; F05D 2230/21; F05D 2300/607; B33Y 80/00
USPC .................... 164/122.1, 122.2, 338.1, 361
See application file for complete search history.

(56) References Cited

U.S. PATENT DOCUMENTS

| | | | | |
|---|---|---|---|---|
| 4,412,577 A | * | 11/1983 | Salkeld et al. ....... | B22D 27/045 164/122.2 |
| 4,714,101 A | | 12/1987 | Terkelsen | |
| 5,256,340 A | | 10/1993 | Allison et al. | |
| 8,851,151 B2 | | 10/2014 | Frasier et al. | |
| 9,144,842 B2 | * | 9/2015 | Feng et al. ........... | B22D 27/045 |
| 10,633,760 B2 | * | 4/2020 | Bullied et al. ....... | B22D 27/045 |
| 2005/0211408 A1 | * | 9/2005 | Bullied et al. .......... | C30B 29/52 164/122.2 |

FOREIGN PATENT DOCUMENTS

| | | |
|---|---|---|
| CN | 102312281 | 1/2012 |
| CN | 205056950 | 3/2016 |

* cited by examiner

*Primary Examiner* — Kevin P Kerns
(74) *Attorney, Agent, or Firm* — Dority & Manning, P.A.

(57) ABSTRACT

A method for producing a cast component is provided. The method includes attaching a ceramic mold to a seed crystal body, the ceramic mold including a cavity defining the shape of the cast component and a seed crystal body interface having a complementary shape to the seed crystal body such that the seed crystal body may be capable of supporting the ceramic mold in a casting oven. The method also includes pouring a liquid metal into the mold such that the crystal seed portion contributes to controlled crystallization of the cast component.

15 Claims, 11 Drawing Sheets

METHOD FOR SEEDING A MOLD

INTRODUCTION

The present invention relates in general to a method for seeding a mold, and more particularly, to a method of seeding a mold when a preheated mold is loaded into a casting furnace. As such, the present invention may be useful in casting operations such as in the casting of superalloys used to make turbine blades and stator vanes for jet aircraft engines or power generation turbine components.

BACKGROUND

A gas turbine engine generally includes at least one compressor to pressurize air to be channeled into a combustor. The engine may include at least one combustor in which at least a portion of the channeled pressurized air is mixed with fuel and ignited. Hot gasses from the compressor flow downstream through at least one turbine section. Each turbine section has rotating blades rotating about an axis and contained within an engine housing. The turbine section or sections can power anyone of the compressor, a fan, a shaft, and/or may provide thrust through expansion through a nozzle.

The turbine blades and/or stator vanes in the turbine portions must be able to withstand thermal stresses due to high temperatures and large temperature fluctuations as well as forces due to the high rotational speed experienced during normal operation of the turbine. As the pressure ratio and efficiency of turbines have increased, the thermal stresses the high pressure and low pressure turbine portion are exposed to have also increased. Accordingly, in combination with manufacturing components of the turbine (for example, turbine blades and stator vanes) from a high-temperature resistant material, effective cooling of the turbine blades, stator vanes and other components have become increasingly important and challenging. To counteract the radiation and convection of heat to the turbine section, several heat removal techniques have been employed in the past; fluid cooling is generally employed to prolong the life of the turbine components. Further, small cooling holes have been drilled though the blade at angles optimized to remove heat and provide a thermal barrier on the surface of each airfoil surface of the turbine blades and stator vanes. Passages are also formed within the turbine and/or stator vanes to provide convection cooling of the surface of each airfoil.

The desire for increased cooling efficiency within turbine engine has led to complex internal cooling passages within turbine components. Conventional techniques for manufacturing engine parts and components involve the process of investment or lostwax casting. One example of investment casting involves the manufacture of a typical blade used in a gas turbine engine. A turbine blade and/or stator vane typically includes hollow airfoils that have radial channels extending along the span of a blade having at least one or more inlets for receiving pressurized cooling air during operation of the engine. Various cooling passages in a blade typically include a serpentine channel disposed in the middle of the airfoil between the leading and trailing edges. The airfoil typically includes inlets extending through the blade for receiving pressurized cooling air, which include local features such as short turbulator ribs or pins for increasing the heat transfer between the heated sidewalls of the airfoil and the internal cooling air.

The manufacture of these turbine blades, typically from high strength, superalloy metal materials, involves numerous steps, as shown in FIGS. 1-4. As shown in FIG. 1, forming a cast component using traditional investment casting typically includes steps of: machining of dies for the outer wax structure and for ceramic cores 101, molding and firing the ceramic cores 102, molding a wax pattern with ceramic core 103, wax assembly prep 104, dipping the wax assembly in ceramic slurry 105, drying the ceramic slurry to provide a shell 106, dewaxing the shell 107, casting and leaching 108, and drilling cooling holes 109.

In the above-mentioned process, a precision ceramic core 200 is manufactured to conform to the serpentine cooling passages desired inside the turbine blade. A precision die or mold is also created which defines the precise 3-D external surface of the turbine blade including its airfoil, platform, and integral dovetail. The ceramic core 200 is assembled inside two die halves which form a space or void therebetween that define the resulting metal portions of the blade. A relatively rigid wax and/or plastic is injected into the assembled dies to fill the void and surround the ceramic core 200, at which point the ceramic core 200 is encapsulated within the wax. The two die halves are split apart and removed to expose and remove the rigid wax and/or plastic that has the precise configuration of the desired blade formed of a molded wax 211. The molded wax blade 211 with encapsulated ceramic core 200 is then attached to a wax tree structure 212. The wax tree structure 212 is formed of a paraffin wax or any wax that is less rigid than the wax used to form the molded wax blade 211. Because the wax of the wax tree 212 will ultimately define a flowpath for molten metal into the ceramic mold, the dimensional accuracy of the outer surface of the wax used to form the tree structure 212 is less crucial. Thus, a softer wax is generally used to form the individual paths of the wax tree 212 than for the precisely molded wax blade 211 of the desired wax blade. The wax blade 211 requires pins 205 for holding the core in place. The tree structure 212 may include a funnel shaped portion 214 for adding molten metal to the mold. As shown in FIGS. 2-4, the tree structure 212 also includes a ceramic filter 213 for filtration of molten metal in the casting operation.

After wax injection and the attachment of wax passageways 212 which form the wax tree structure, the entire wax tree structure 212, ceramic filter 213, and wax turbine blade 211 is then coated with a ceramic material to form a ceramic shell 206, 204 as shown in FIG. 3. Then, the wax is melted and removed from the ceramic shell 206, leaving a corresponding void or space 201,207 between the ceramic shell 206 and the internal ceramic core 200. Further, once the wax tree structure 212 is melted, the ceramic shell 204 defines a flow path in fluid communication with the void or space 201, 207. After the wax is removed, the ceramic core is held in place by pins 205. As shown in FIG. 4, molten superalloy metal 208 is then poured into the shell 206 through the flow path defined by a portion of the ceramic shell 204. The molten superalloy may include any one of stainless steel, aluminum, titanium, INCONEL 625, INCONEL 718, INCONEL 188, cobalt chrome, nickel, among other metal materials or any alloy; such as nickel (Ni) superalloys, and/or Ni superalloy single crystal alloys. For example, the above alloys may include materials with trade names, HAYNES 188, HAYNES 625, SUPER ALLOY INCONEL 625, CHRONIN 625, ALTEMP 625, NICKELVAC 625, NICROFER 6020, INCONEL 188, and any other material having material properties attractive for the formation of components using the above-mentioned techniques. The molten metal 208 fills the voids 201, 207 and encapsulates the ceramic core 200 contained in the shell 206. The molten metal 208 is cooled and solidifies, and then the external ceramic shell 206 and internal ceramic core 200 are suitably removed leaving behind the desired metallic turbine blade in which the internal cooling passages are found. In order to provide a pathway for removing the ceramic core material via a leaching process, a ball chute (not shown) and the tip pins (not shown) may be provided. Generally, after the leaching process, a ball chute and tip pin holes within the turbine blade must be subsequently brazed shut.

The cast turbine blade 208 typically undergoes additional post-casting modifications, such as drilling of suitable rows of film cooling holes through the sidewalls of the airfoil as desired for providing outlets for the internally channeled cooling air which then forms a protective cooling air film or blanket (generally referred to as film cooling) over the external surface of the airfoil during operation in the gas turbine engine. After the turbine blade is removed from the ceramic mold, pins 205 which held the ceramic core 200 form a passageway that is later brazed shut to provide the desired pathway of air through the internal voids of the cast turbine blade. However, these post-casting modifications are limited and given the ever increasing complexity of turbine engines and the recognized efficiency improvements provided by certain cooling circuits inside turbine blades, more complicated and intricate internal geometries are required. While investment casting is capable of manufacturing these parts, positional precision and intricate internal geometries become more complex to manufacture using these conventional manufacturing processes and thus increase manufacturing time and expense significantly. Accordingly, it was desirable to provide an improved casting method for three dimensional components having intricate internal voids and cooling circuits.

Additive manufacturing techniques and 3-D printing allowed molds to be manufactured without the toolpath and/or molding limitations associated with subtractive manufacturing. For example, methods for using 3-D printing to produce a ceramic core-shell mold are described in U.S. Pat. No. 8,851,151 assigned to Rolls-Royce Corporation. The methods for making the molds include powder bed ceramic processes such as disclosed U.S. Pat. No. 5,387,380 assigned to Massachusetts Institute of Technology, and selective laser activation (SLA) such as disclosed in U.S. Pat. No. 5,256,340 assigned to 3D Systems, Inc. The ceramic core-shell molds according to the '151 patent are significantly limited by the printing resolution capabilities of these processes. As shown in FIG. 5, core portion 301 and shell portion 302 of integrated core-shell mold 300 is held together via a series of tie structures 303 provided at the bottom edge of the mold 300. Cooling passages are proposed in the' 151 patent that include staggered vertical cavities joined by short cylinders, the length of which is nearly the same as its diameter. A superalloy turbine blade is then formed in the core-shell mold using known techniques disclosed in the' 151 patent, and incorporated herein by reference. After a turbine blade is cast in one of these core-shell molds, the mold is removed to reveal a cast superalloy turbine blade.

FIG. 6 illustrates a method of seeding a mold as described in the' 151 patent. The mold 605 has an internal cavity 606 for receiving molten metal. The mold 605 has a vent end 607 for the passage of gaseous material to and from the internal cavity 606 and starter seed receiving inlet 609 for receiving and engaging a metallic starter seed 608. The metallic starter seed 608 is positioned to receive molten metal on a surface 608a. Located within the mold 605 is a starter seed auxiliary heater 615 and a supplemental mold heater 616. An insulator 610 is positioned between a lower surface 605a of the mold 605 and a heat transfer apparatus 611 to minimize heat transfer from the casting mold 605. The heat transfer apparatus 611 includes a pair of arms 613 and 614 that are moveable into a position to abut and maintain contact with a surface 618 of the starter seed 608. The abutting relationship of the heat transfer apparatus 611 and the starter seed 608 is maintainable until the arms 613 and 614 are positively released from the starter seed 608. A precision locating member 612 contacts a bottom surface 608b of the starter seed 608 so as to precisely locate the vertical height of the melt surfaces 608a within the molten metal receiving cavity 606. A cooling media passageway 617 is formed in each of the pair of arms 613 and 614 for the passage of cooling media therethrough. The molten metal within the cavity 606 transfers heat to the starter seed 608 which in turn transfers the heat through the surfaces 618 to the chilled pair of arms 613 and 614. The cooling media flowing through the passageways 617 removes the heat from the arms 613 and 614. Thus, a temperature gradient is created through the starter seed 608 to cause directional solidification of the molten metal within the cavity 606.

SUMMARY

The following presents a simplified summary of one or more aspects of the present disclosure in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

The foregoing and/or other aspects of the present invention may be achieved by a method of producing a cast component. The method includes attaching a ceramic mold to a seed crystal body, the ceramic mold including a cavity defining the shape of the cast component and a seed crystal body interface having a complementary shape to the seed crystal body such that the seed crystal body may be capable of supporting the ceramic mold in a casting oven. The method also includes pouring a liquid metal into the mold such that the crystal seed portion contributes to controlled crystallization of the cast component.

In an aspect, the seed crystal body interface of the ceramic mold has a funnel shape and the seed crystal body has a cone shape.

In another aspect, the seed crystal body may be attached to a base support in the casting oven when the ceramic mold is attached to the seed crystal body.

In yet another aspect, the ceramic mold may be attached to the seed crystal body, an overcoat of ceramic may be applied to at least a portion of the ceramic mold and the seed crystal body to form a casting assembly, and the casting assembly may be secured within the casting oven before pouring the liquid metal.

In another aspect, the casting assembly may be secured within the casting oven through an attachment mechanism on the seed crystal body.

In another aspect, the seed crystal body may be a one-piece single crystal metal with an attachment mechanism for securing the seed crystal body within the casting oven.

In yet another aspect, the seed crystal body interface of the casting mold includes an alignment feature corresponding to an alignment feature of the seed crystal body for controlling the crystalline orientation of the cast component within the casting mold.

In yet another aspect, the ceramic mold includes a passage that offsets the seed crystal body interface from the cavity of the ceramic mold.

The foregoing and/or other aspects of the present invention may be achieved by a ceramic mold for producing a cast component. In one aspect, the ceramic mold includes a cavity defining the shape of the cast component, a seed crystal body interface having a complementary shape to a seed crystal body such that the seed crystal body is capable of supporting the ceramic mold in a casting oven, and an alignment feature corresponding to an alignment feature of the seed crystal body for controlling the crystalline orientation of the cast component within the casting mold.

In an aspect, the seed crystal body interface of the ceramic mold may have a funnel shape corresponding to a cone shape of the seed crystal body.

In another aspect, the ceramic mold includes a passage that offsets the seed crystal body interface from the cavity of the ceramic mold.

The foregoing and/or other aspects of the present invention may be achieved by a casting assembly for producing a cast component. The casting assembly includes a ceramic mold including a cavity defining the shape of the cast component and a seed crystal body interface, a seed crystal body, the seed crystal body interface having a complementary shape to the seed crystal body, and at least one ceramic overcoat that covers at least a portion of the ceramic mold and the seed crystal body to form the casting assembly.

In an aspect, the casting assembly may also include an attachment mechanism on the seed crystal body for securing the seed crystal body within the casting oven.

In another aspect, the seed crystal body is a one-piece single crystal metal with an attachment mechanism for securing the seed crystal body within the casting oven.

Other features and aspects may be apparent from the following detailed description, the drawings, and the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. For example, the present invention provides a preferred method for making cast metal parts, and preferably those cast metal parts used in the manufacture of jet aircraft engines. Specifically, the production of single crystal, nickel-based superalloy cast parts such as turbine blades, vanes, and shroud components can be advantageously produced in accordance with this invention. However, other cast metal components may be prepared using the techniques and integrated ceramic molds of the present invention.

Generally, single crystal molds require a seed but the usual methods result in additional steps or compromised seed conditions. Single crystal molds are typically seeded in two ways. One traditional method is to place a metal seed in a wax assembly and shell around it making the seed integral to the mold. Another traditional method is cementing a seed into a cavity shaped as the negative of the seed after the ceramic mold has been fired. An aspect of the present invention involves seeding a mold when a preheated mold is loaded into a casting furnace. By making the seeding part of normal casting steps (i.e. load furnace), the present invention may reduce defects associated with typical methods such as, for example, seed oxidation from firing the mold with seed or introducing inclusions by cementing in seeds before cast.

Figure 1:
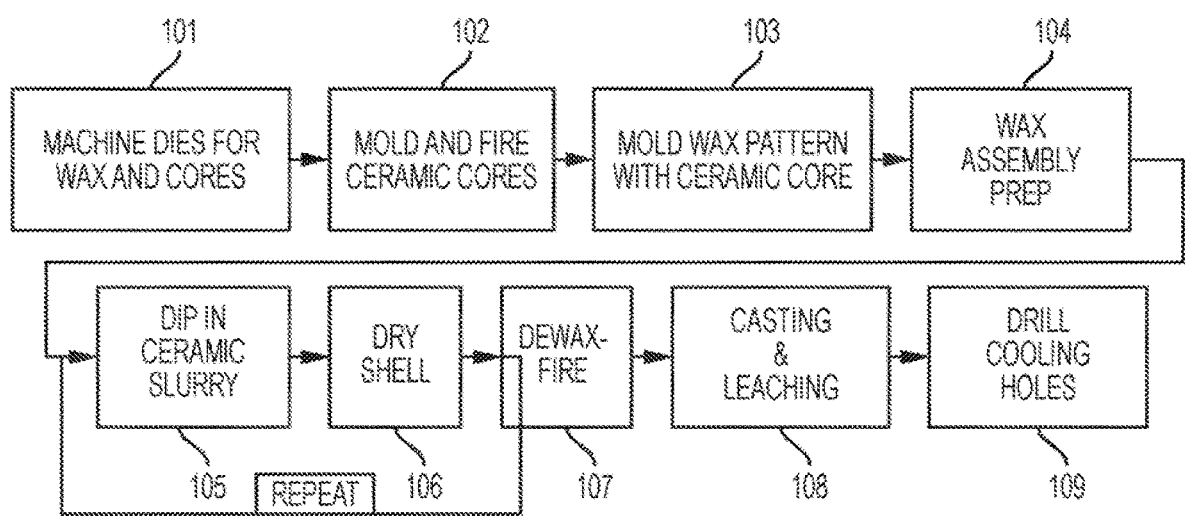
FIG. 1 is a block diagram showing the steps for conventional investment casting.
Figure 2:
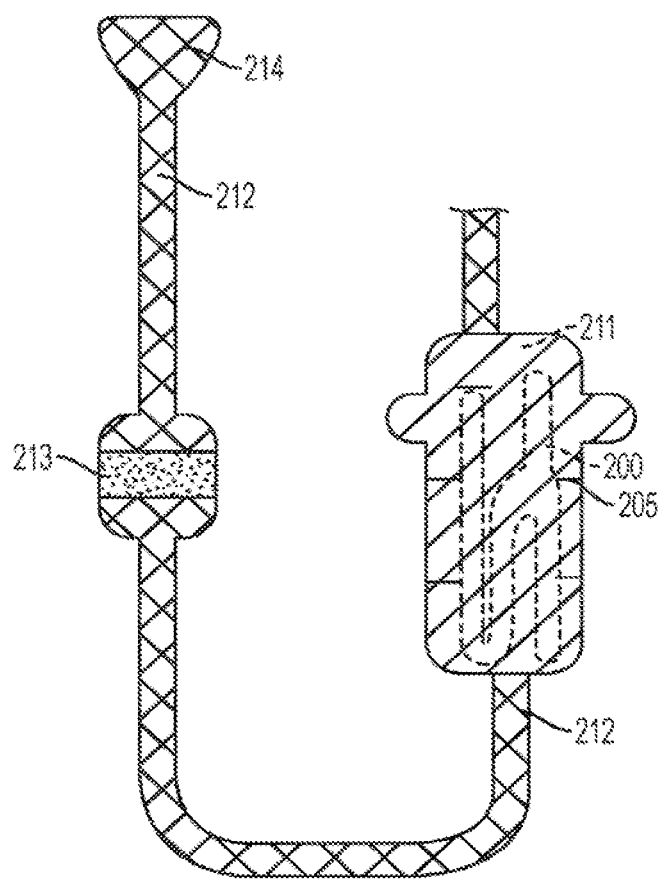
FIG. 2 is a diagram showing a conventional wax pattern attached to a wax tree structure for investment casting of a turbine blade.
Figure 3:
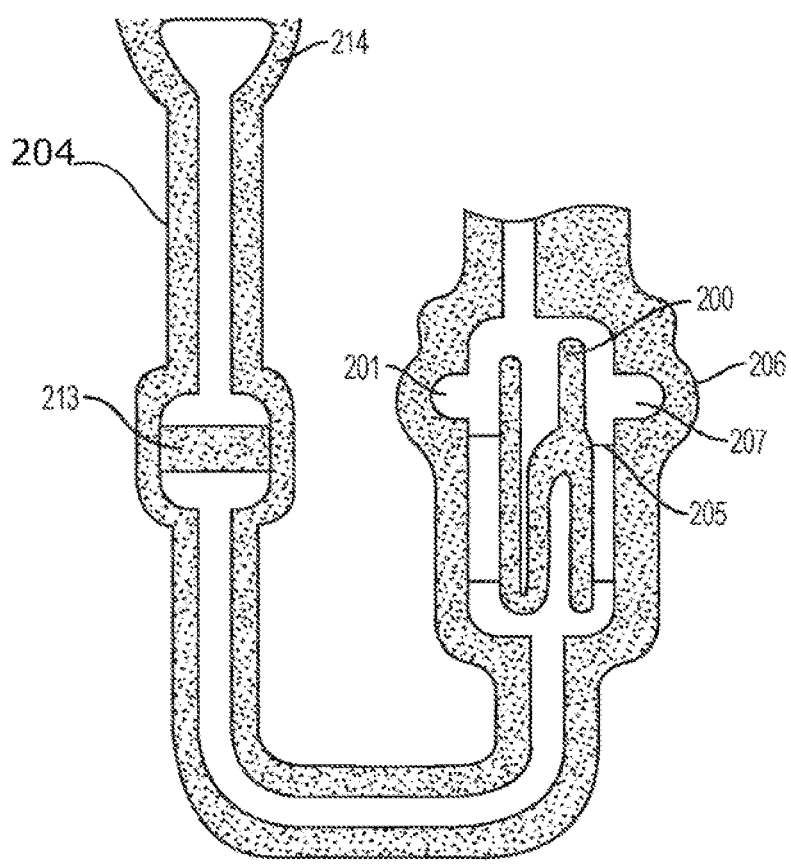
FIG. 3 is a diagram showing the conventional ceramic mold of FIG. 2 after the wax has been removed.
Figure 4:
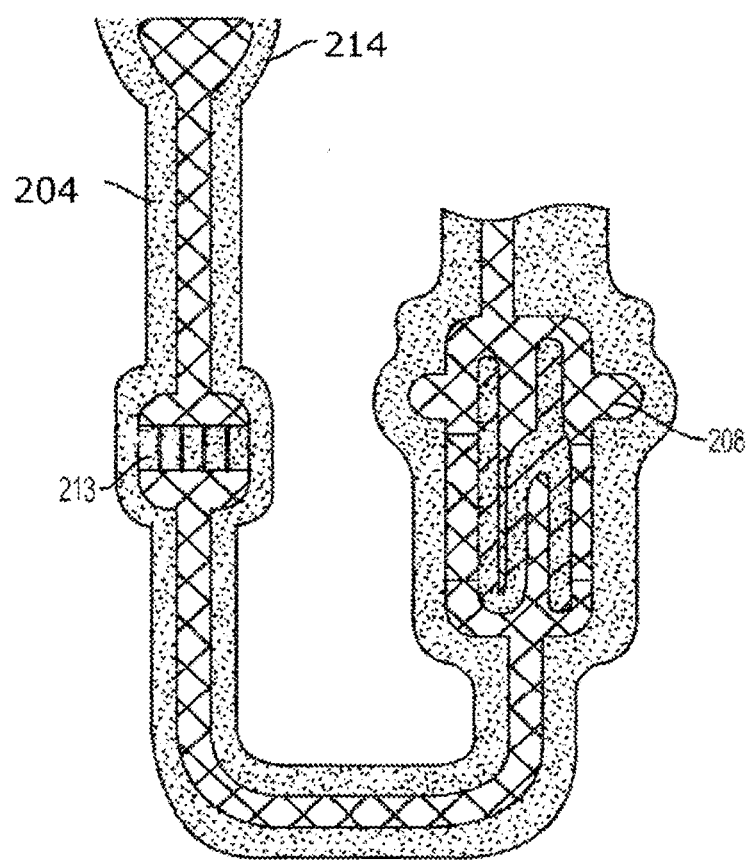
FIG. 4 is a diagram showing the conventional ceramic mold of FIG. 2 after molten metal is poured into the mold.
Figure 5:
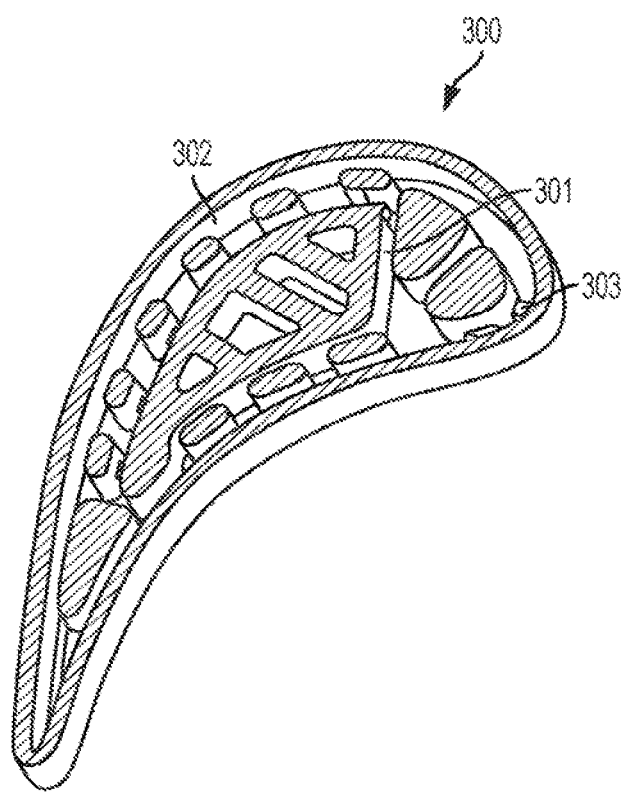
FIG. 5 is a diagram showing a perspective view of a prior art integrated core-shell mold with ties connecting the core and shell portions.
Figure 6:
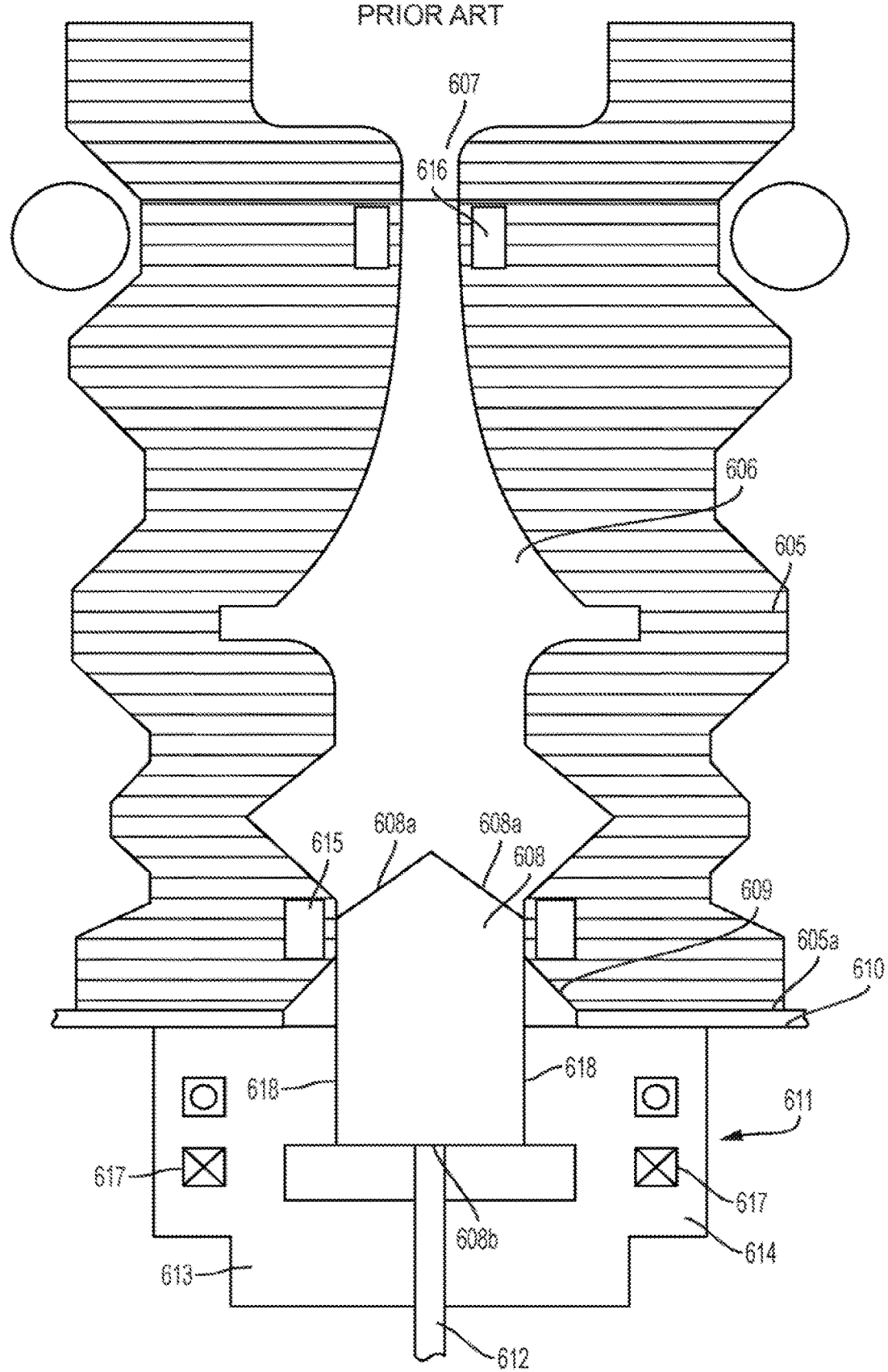
FIG. 6 is a diagram showing a prior art apparatus having a starter seed within a casting mold.
Figure 7A:
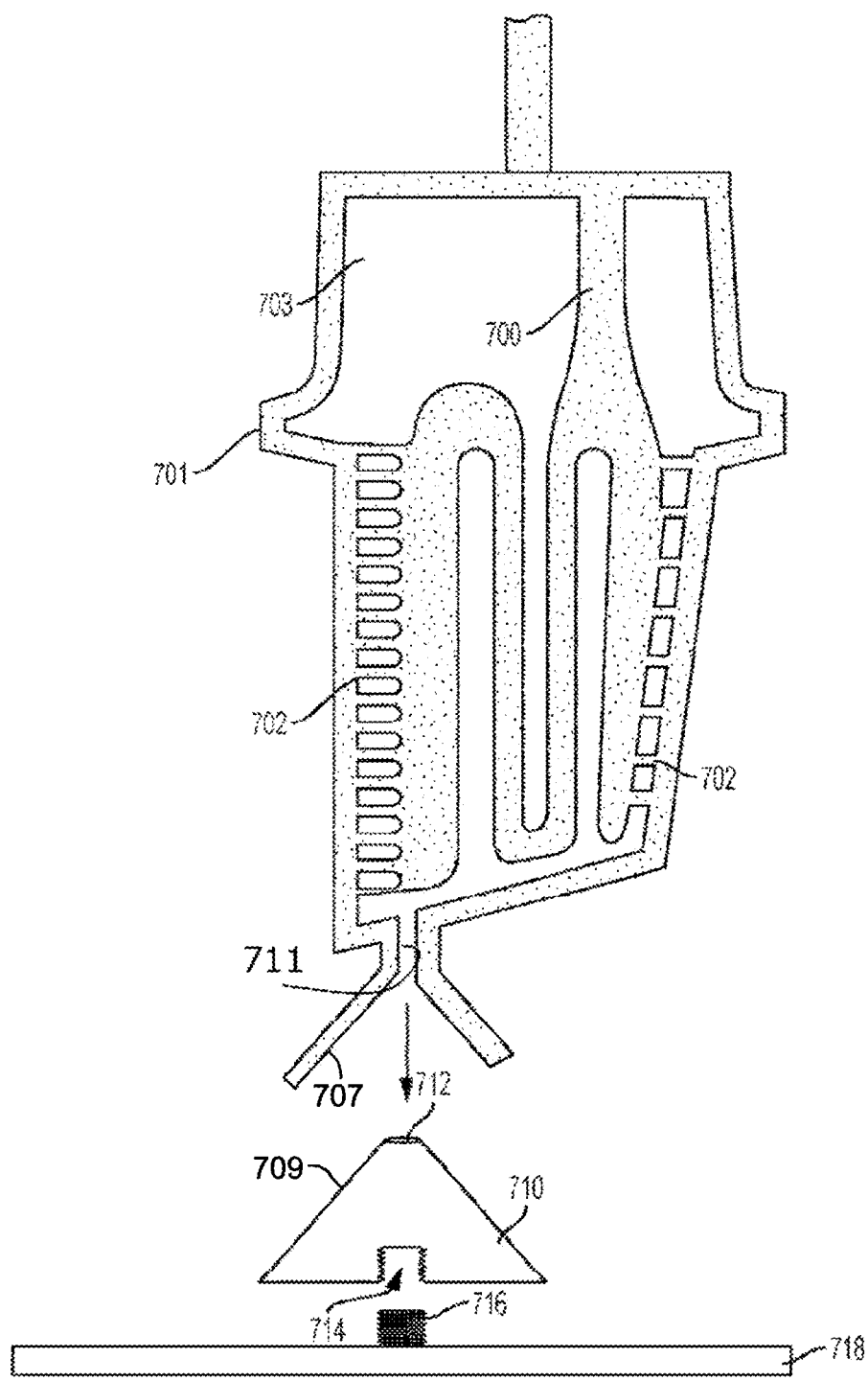
FIGS. 7A and 7B are diagrams illustrating a cross-sectional side view of a ceramic mold and crystal growth structure, according to an embodiment of the present invention.

FIG. 7A is a diagram of a side view of a ceramic mold and crystal growth structure, according to an embodiment of the present invention. As shown in FIG. 7A, a core 700 may be connected to a shell 701 through several filaments 702. The core 700 and the shell 701 forms the core-shell mold 700/701 which defines a cavity 703 for investment casting a turbine blade. A bottom portion of the core-shell mold 700/701 may be configured with a funnel shape to correspond to a ceramic cone 710. According to an aspect, the core-shell mold 700/701 may be configured as a seed crystal body interface to accommodate the ceramic cone 710 such that the core-shell mold 700/701 is tightly fitted onto the ceramic cone 710. The core-shell mold 700/701 may be configured with an interface having an alignment feature (shown schematically at 707 as a flat surface) that corresponds to an alignment feature of the ceramic cone 710 (shown schematically at 711 as a flat surface) such that a crystalline orientation of the resulting cast component may be controlled with the coreshell mold 700/701. When attached, the ceramic cone 710 and the core-shell mold 700/701 may form a casting assembly to be placed on a support plate 718. The support plate 718 may be configured with a screw 716. A bottom portion of the ceramic cone 710 may be constructed with an attachment mechanism 714 for receiving the screw 716 provided on the support plate 718.

A top portion of the ceramic cone 710 may include a seed crystal 712 for solidifying a liquid metal, to be discussed below.

While the present invention describes the ceramic cone 710 and seed crystal 712 as separate components, the present invention may not be limited thereto. In another exemplary embodiment, the ceramic cone and seed crystal may be configured as a single crystal metal growth piece to fit into a ceramic mold. The single crystal metal growth piece defines a seed crystal body configured to match the seed body interface. The present invention also describes the bottom portion of the core-shell mold 700/701 with a funnel shape to correspond to the triangular-cone shaped ceramic cone 710, but may not be limited thereto. The funnel shape of the bottom portion of the core shell mold 700/701 is spaced apart from the cavity 703 by a passage 711. In this regard, the bottom portion of the core shell mold 700/701 is fluidly connected to the cavity 703 by the passage 711 which is configured to offset the bottom portion from the cavity 703. In other exemplary embodiments, the configuration of the bottom portion of the core-shell mold 700/701 and the ceramic cone 710 may be various other shapes such as a pyramid shape that correspond to each other and allow a bottom portion of a core-shell mold to accommodate and tightly fit onto a ceramic cone.

Figure 7B:
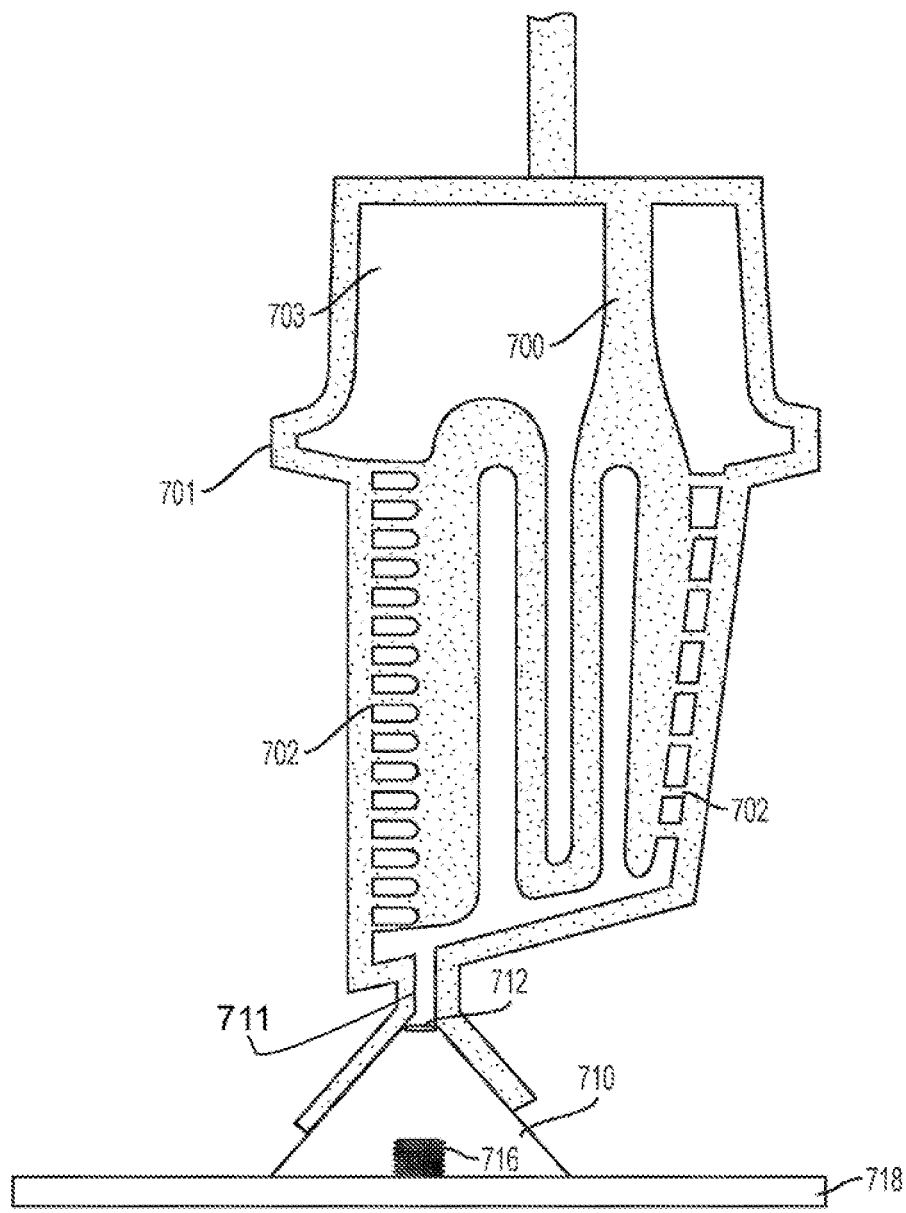

FIG. 7B is an illustration of a preferred exemplary embodiment in which the support plate 718 is configured to hold the ceramic cone 710 with the core-shell mold 700/701 attached thereto. A top portion of the core-shell mold 700/701 may be configured with a passage way for pouring a molten metal into an inner cavity 703.

Figure 8:
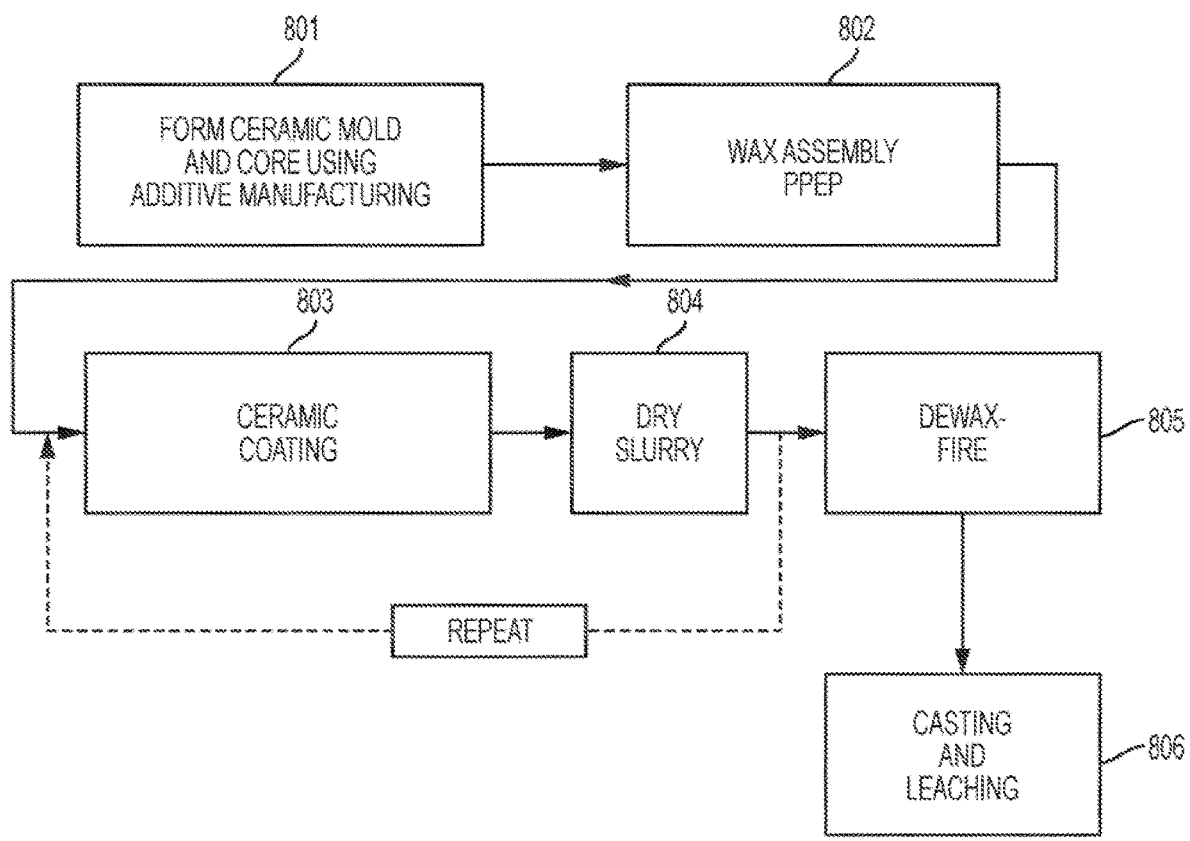
FIG. 8 is a block diagram illustrating the casting process according to an embodiment of the present invention.

FIG. 8 is a block diagram illustrating the casting process according to an embodiment of the present invention. By employing a Direct Light Printing (DLP) process or any other additive manufacturing method to form a ceramic core-shell mold, the manufacturing of a component requires significantly less steps than typical investment casting. FIG. 8 shows the steps of forming a ceramic mold and core using additive manufacturing 801, prepping the wax assembly 802, ceramic coating 803, slurry drying 804, a dewaxing and/or firing process 805, and casting and leaching the ceramic material 806. It may be appreciated that the step of ceramic coating 803 and drying the slurry 804 may be repeated as shown in FIG. 8. The above-mentioned process of forming a mold may include forming a ceramic mold and core using a DLP process such that the mold is formed as a core-shell structure and is formed of a first photopolymerizable ceramic material. Once a mold is formed, the mold may be joined with several molds and/or may have a wax portion added 802 which will form a flow path for the molten material. The core-shell mold and an additional wax structures added previously may then undergo a dipping or coating process 803 to form a ceramic coating on the outer surface of the shell of the core-shell mold and on the outer surface of any added wax structures. The core-shell mold may then undergo a drying process to dry the slurry 804. As mentioned above, steps 803 and 804 may be repeated. Then, the core-shell mold and outer ceramic shell may undergo a dewaxing and/or firming process 805 to remove the wax and/or to sinter the ceramic materials which form the mold. It may be appreciated that steps 802, 803, 804, and 805 may be omitted if the ceramic mold and core in step 801 is manufactured to the final mold shape and ready for pouring. The molten metal may then be poured into the mold. Once the metal has solidified, the core-shell mold and outer shell may be removed through either leaching of the ceramic material and/or through mechanical removal of the mold.

Figure 9A:
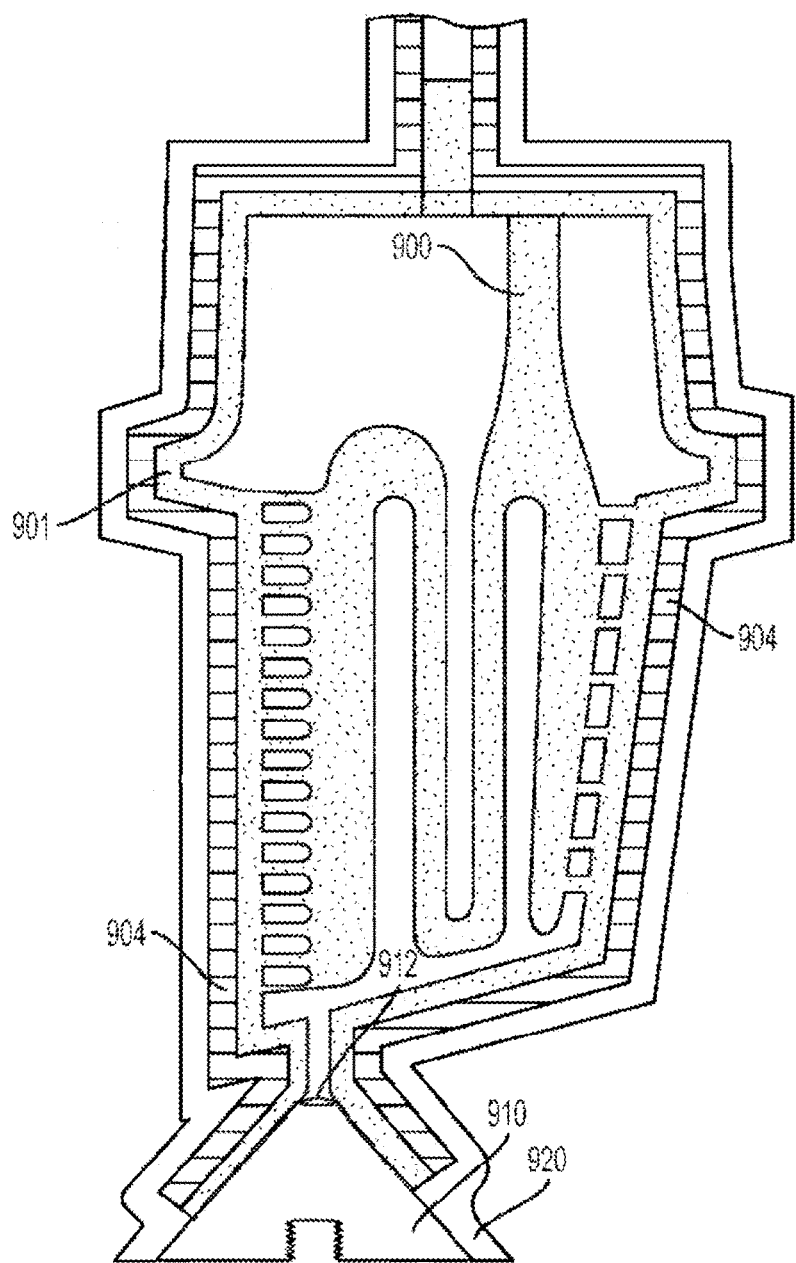
FIGS. 9A and 9B are diagrams illustrating a cross-sectional side view of a ceramic mold and crystal growth structure, according to another embodiment of the present invention.
Figure 9B:
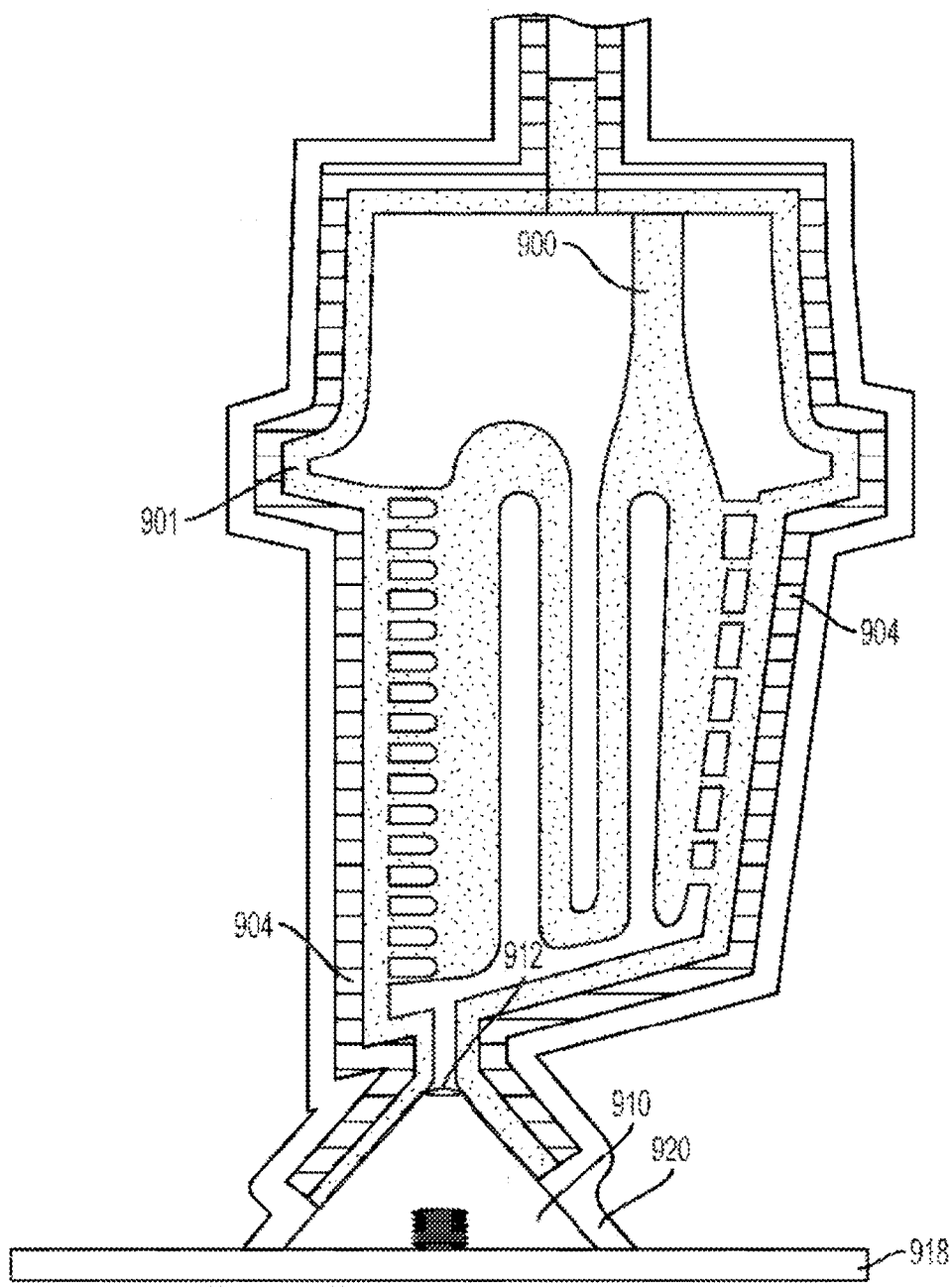

FIGS. 9A and 9B are diagrams illustrating a cross-sectional side view of a ceramic mold and crystal growth structure, according to another embodiment of the present invention. In FIG. 9A, a first outer ceramic layer 904 may be formed at an outer boundary of the core/shell mold 900/901. The first outer ceramic layer 904 may be formed, for example, by a process of dipping the core-shell mold into a ceramic slurry. According to an aspect, for example, an outer ceramic layer may be formed as a single layer clipping the core-shell mold into a ceramic slurry, drying the slurry, and dipping the core-shell mold into either the same ceramic slurry and/or a different type of slurry to form an outer shell on the core-shell mold. A ceramic layer may provide structural qualities to the core-shell mold, serve as a reinforcement for increasing the durability of the encased core-shell mold, and improve the thermal properties of the mold. A refractory grain may be sifted onto the slurry coating between layers. It may be appreciated that other forms of forming a ceramic coating may be used in lieu of, or in combination with, the dipping process mentioned above. For example, a ceramic and/or other material may be sprayed onto the core-shell. As an example, the above-mentioned slurry may include colloidal silica and a ceramic powder (e.g. $Al_2O_3$, $SiO_2$, $ZrSiO_4$, $ZrO_2$, $Y_2O_3$, AlN, SiC). The abovementioned grain may be applied between layers and may include ceramic sand (e.g. $Al_2O_3$, $SiO_2$, $ZrSiO_4$, $ZrO_2$, $Y_2O_3$, AlN, SiC) in a mesh of 90-120. Subsequent layers of slurry may be applied and subsequent layers of ceramic sand may be applied in 20-70 mesh and/or 10-30 mesh. Once the necessary outer layer is formed on the core-shell, the mold may be fired to sinter the material; after which, any of the above-mentioned metals (e.g. superalloy) may be poured into the mold.

According to an exemplary embodiment as shown in FIGS. 9A and 9B, a second outer ceramic layer 920 may be formed at an outer boundary of the ceramic layer 904. In this aspect, the core-shell mold 900/901, ceramic cone 910 having the seed crystal 912 positioned on top thereof, ceramic layer 904, and second outer ceramic layer 920 may be provided as a single cast assembly to be placed on the support plate 918 and subsequently loaded into a casting furnace (not shown). The second outer ceramic layer 920 may be made from a material and be constructed to have similar thermal expansion properties as the ceramic cone 910. In this way, cracking or unnecessary stress from the heat generated during casting may be avoided. In the case where a second outer ceramic layer 920 is utilized, the outer layer may increase the strength of the overall mold and/or modulate the thermal properties of the mold.

According to exemplary embodiments described above, the seed crystal may be in fluid connection with the inner cavity of the ceramic mold and filled with a liquid metal. When the liquid metal is poured into the inner cavity, crystals begin to grow at the seed crystal in an upwards direction to produce a solidified cast object. It may be appreciated by persons skilled in the art that a seed crystal growth structure in accordance with the present exemplary embodiments are not generally viewed as a holder for ceramic molds which are generally placed on chilled plates for support. Once the liquid metal is hardened, the ceramic core and shell may be leached out. Upon leaching, the resulting cast object may be a turbine blade.

In accordance with the above described embodiments, the present invention provides a unique timing involving inserting a seed when loading a mold into a casting furnace not typically practical when using multiple piece molds. According to an aspect, seed exposure to elevated temperatures may be minimized prior to casting and seed oxidation may be reduced and/or eliminated (e.g., unlike in conventional methods where the mold is fired when placed in wax or external preheat when cemented). The present invention further facilitates loading of the mold at elevated firing temperatures since the seed does not need to be cemented in, thereby eliminating mold thermal cycles. For example, the mold may be loaded directly from mold fire; as well, the printed mold may be loaded directly from the core fire.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

What is claimed is:

1. A method of producing a cast component, comprising:
attaching a ceramic mold to a seed crystal body, the ceramic mold comprising a cavity defining a shape of the cast component and a seed crystal body interface having a complementary shape to the seed crystal body such that the ceramic mold is supported on the seed crystal body in a casting oven, with the seed crystal body contacting the complementary shape of the seed crystal body interface; and
pouring a liquid metal into the mold such that the seed crystal body contributes to controlled crystallization of the cast component.

2. The method of claim 1, wherein the seed crystal body interface of the ceramic mold has a funnel shape and the seed crystal body has a cone shape.

3. The method of claim 1, wherein the seed crystal body is attached to a base support in the casting oven when the ceramic mold is attached to the seed crystal body.

4. The method of claim 1, wherein the ceramic mold is attached to the seed crystal body, an overcoat of ceramic is applied to at least a portion of the ceramic mold and the seed crystal body to form a casting assembly, and the casting assembly is secured within the casting oven before pouring the liquid metal.

5. The method of claim 4, wherein the casting assembly is secured within the casting oven through an attachment mechanism on the seed crystal body.

6. The method of claim 1, wherein the seed crystal body is a one-piece single crystal metal with an attachment mechanism for securing the seed crystal body within the casting oven.

7. The method of claim 1, wherein the seed crystal body interface of the ceramic mold includes an alignment feature corresponding to an alignment feature of the seed crystal body for controlling crystalline orientation of the cast component within the ceramic mold.

8. The method of claim 1, wherein the ceramic mold includes a passage that is configured to offset the seed crystal body interface from the cavity of the ceramic mold.

9. A casting assembly for producing a cast component, comprising:
a ceramic mold comprising a cavity defining a shape of the cast component;
a seed crystal body interface having an outward tapered shape complementary to a tapered shape of a seed crystal body such that the seed crystal body is configured to support the ceramic mold in a casting oven atop the outward tapered shape of the seed crystal body interface.

10. The casting assembly of claim 9, wherein the seed crystal body interface of the ceramic mold has a funnel shape corresponding to a cone shape of the seed crystal body.

11. The casting assembly of claim 9, wherein the ceramic mold includes a passage that offsets the seed crystal body interface from the cavity of the ceramic mold.

12. The casting assembly of claim 9 further comprising an alignment feature corresponding to an alignment feature of the seed crystal body for controlling crystalline orientation of the cast component within the ceramic mold.

13. A casting assembly for producing a cast component, comprising:
a ceramic mold comprising a cavity defining a shape of the cast component and a seed crystal body interface; and
a seed crystal body, the seed crystal body interface having a complementary shape to the seed crystal body, wherein the ceramic mold is supported atop the seed crystal body, with the seed crystal body contacting the complementary shape of the seed crystal body interface, and at least one ceramic overcoat that covers at least a portion of an outer surface of the ceramic mold and a portion of the seed crystal body to form the casting assembly.

14. The casting assembly of claim 13, further comprising an attachment mechanism on the seed crystal body for securing the seed crystal body within a casting oven.

15. The casting assembly of claim 13, wherein the seed crystal body is a one-piece single crystal metal with an attachment mechanism for securing the seed crystal body within a casting oven.

* * * * *